United States Patent
Cazaux et al.

(10) Patent No.: US 10,264,242 B2
(45) Date of Patent: Apr. 16, 2019

(54) IMAGE SENSOR FOR CAPTURING 2D IMAGE AND DEPTH

(71) Applicant: Commissariat à l'Energie Atomique et aux Energies Alternatives, Paris (FR)

(72) Inventors: Yvon Cazaux, Grenoble (FR); Benoit Giffard, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/829,662

(22) Filed: Dec. 1, 2017

(65) Prior Publication Data

US 2018/0167606 A1 Jun. 14, 2018

(30) Foreign Application Priority Data

Dec. 12, 2016 (FR) .................................. 16 62340

(51) Int. Cl.
*H04N 13/286* (2018.01)
*H04N 5/33* (2006.01)
(Continued)

(52) U.S. Cl.
CPC ......... *H04N 13/286* (2018.05); *G01S 7/4914* (2013.01); *H01L 27/1463* (2013.01); *H01L 27/14603* (2013.01); *H04N 5/33* (2013.01)

(58) Field of Classification Search
CPC ...... H04N 13/286; H04N 5/33; G01S 7/4914; H01L 27/1463; H01L 27/14603
See application file for complete search history.

(56) References Cited

U.S. PATENT DOCUMENTS

| 9,985,068 B2 * | 5/2018 | Watanabe ......... H01L 27/14614 |
| 2012/0146172 A1 * | 6/2012 | Carey ............... H01L 27/14629 |
| | | 257/443 |

(Continued)

FOREIGN PATENT DOCUMENTS

WO 2011099759 A2 8/2011

OTHER PUBLICATIONS

Preliminary Search Report in French Patent Application No. 1662340 dated Sep. 27, 2017, 2 pages.

(Continued)

*Primary Examiner* — Nhan T Tran
(74) *Attorney, Agent, or Firm* — Moreno IP Law LLC

(57) ABSTRACT

The invention concerns an image sensor comprising: a depth pixel (PZ) having: a detection zone (PD); a first memory ($mem_1$) electrically coupled to the detection zone by a first gate (310); a second memory ($mem_2$) electrically coupled to the detection zone by a second gate (314); and a third memory ($mem_3$) electrically coupled to the detection zone by a third gate (316), wherein the first, second and third memories are each formed by a doped region sandwiched between first and second parallel straight walls (404, 406), the first and second walls of each memory having a conductive core adapted to receive a biasing voltage; and a plurality of 2D image pixels (P1 to P8) positioned adjacent to the depth pixel, wherein the first, second and third memories extend to form at least partial isolation walls between corresponding adjacent pairs of the 2D image pixels.

12 Claims, 6 Drawing Sheets

(51) Int. Cl.
    *G01S 7/491*     (2006.01)
    *H01L 27/146*     (2006.01)

(56) References Cited

U.S. PATENT DOCUMENTS

| | | | |
|---|---|---|---|
| 2013/0010072 A1* | 1/2013 | Kim | H01L 27/14609 348/46 |
| 2014/0252437 A1* | 9/2014 | Oh | H01L 27/14643 257/292 |
| 2014/0347442 A1* | 11/2014 | Wang | H04N 5/2256 348/46 |
| 2015/0130902 A1* | 5/2015 | Fossum | H01L 27/14603 348/46 |
| 2015/0130904 A1* | 5/2015 | Bae | G01S 7/4915 348/46 |
| 2016/0043130 A1* | 2/2016 | Ohguro | H01L 27/1463 257/225 |

OTHER PUBLICATIONS

Lange, Robert et al.; Solid-State Time-of-Flight Range Camera; IEEE Journal of Quantum Electronics; vol. 37, No. 3; Mar. 2011.

* cited by examiner

IMAGE SENSOR FOR CAPTURING 2D IMAGE AND DEPTH

FIELD

The present disclosure relates to the field of image sensors, and in particular to image sensors capable of capturing a 2D image and depth information.

BACKGROUND

Image sensors capable of capturing depth information have been proposed. For example, time of flight (ToF) sensors operate by transmitting a light signal into an image scene, and then detecting the return light signal reflected by objects in the image scene. By calculating the time of flight of the light signal, the distance from the sensor of objects in the image scene can be estimated. For example, the pixels of such a sensor could be based on SPADs (single photon avalanche diodes).

For some applications, it would be desirable to be able to capture both a 2D image of a scene, and a corresponding depth image of the scene.

While one solution for achieving this could be to use separate image sensors to capture the 2D image and the depth image, such a solution is non-optimal in view of the fact that these image sensors will have different viewpoints of the image scene, leading to a misalignment between the pixels of the corresponding images. Furthermore, the use of two sensors would add volume and cost to the device.

Another solution would be to integrate both 2D image pixels and depth pixels within a same sensor array. However, a problem is that the depth pixels generally have significantly larger dimensions that 2D image pixels, making such an integration complex.

SUMMARY

It is an aim of embodiments of the present description to at least partially address one or more problems in the prior art.

According to one aspect, there is provided an image sensor comprising: a depth pixel having: a detection zone; a first memory electrically coupled to the detection zone by a first gate; a second memory electrically coupled to the detection zone by a second gate; and a third memory electrically coupled to the detection zone by a third gate, wherein the first, second and third memories are each formed by a doped region sandwiched between first and second parallel straight walls, the first and second walls of each memory having a conductive core adapted to receive a biasing voltage; and a plurality of 2D image pixels positioned adjacent to the depth pixel, wherein the first, second and third memories extend to form at least partial isolation walls between corresponding adjacent pairs of the 2D image pixels.

According to one embodiment, the walls of the first memory extend between detection zones of the first and second pixels of the plurality of 2D image pixels; the walls of the second memory extend between detection zones of the third and fourth pixels of the plurality of 2D image pixels; and the walls of the third memory extend between detection zones of the fifth and sixth pixels of the plurality of 2D image pixels.

According to one embodiment, the depth pixel further comprises a further structure electrically coupled to the detection zone of the depth pixel by a fourth gate, the further structure comprising an n-type region sandwiched between parallel straight walls, and wherein the walls of the further structure extend between detection zones of the seventh and eighth pixels of the plurality of 2D image pixels.

According to one embodiment, the image sensor comprises a plurality of two-by-two blocks of pixels, at least some of said two-by-two blocks of pixels comprising the above depth pixel and three 2D image pixels.

According to one embodiment, the image sensor consists of a plurality of two-by-two blocks of pixels, each two-by-two block of pixels comprising the above depth pixel and three 2D image pixels.

According to one embodiment, the image sensor comprises an array consisting of a plurality of n-by-n blocks of 2D image pixels and a plurality of the above depth pixels, each depth pixel occupying a space in the array corresponding to the space occupied by an n-by-n block of 2D image pixels, where n is an integer equal to 2 or more.

According to one embodiment, each 2D image pixel is isolated from adjacent 2D image pixels by corresponding isolation walls, at least some of said isolation walls being formed by said first, second and third memories, and one or more of said isolation walls being formed by an isolation trench.

According to one embodiment, the first, second and third memories each has as aspect ratio of at least 4.

According to one embodiment, the length of a charge storage region of each of the first, second and third memories is greater than the width of the depth pixel.

According to one embodiment, the depth pixel and 2D image pixels are formed in a layer of semiconductor positioned over a buried insulating layer.

According to a further aspect, there is provided an imaging device comprising: the above image sensor; and a light signal transmission circuit configured to transmit light in the near infrared range.

According to one embodiment, the depth pixel is covered by a filter having a pass band limited to the near infrared range.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION OF THE PRESENT EMBODIMENTS

Throughout the following description, the term "connected" is used to designate a direct connection between circuit elements, whereas the term "coupled" is used to designate a connection that may be direct, or may be via one or more intermediate elements such as resistors, capacitors or transistors. The term "around" is used to designate a tolerance of plus or minus 10 percent of the value in question.

Figure 1:
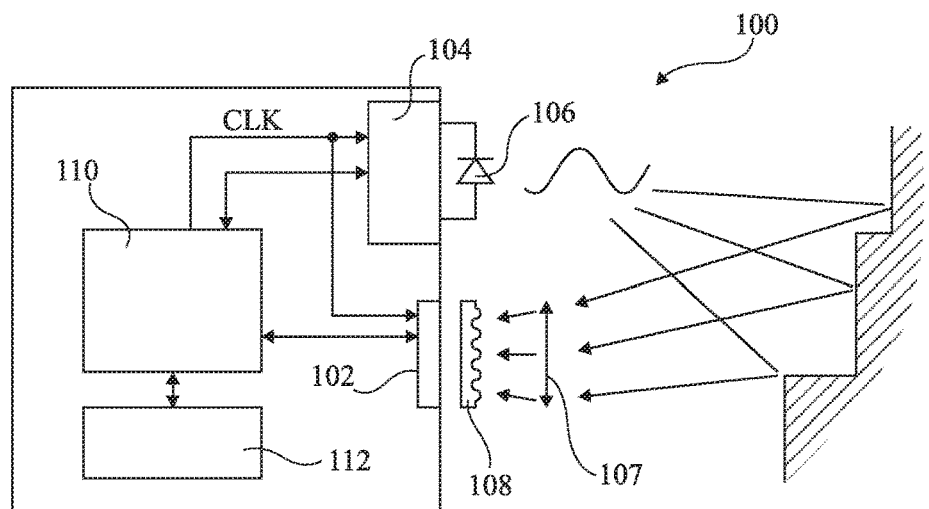
FIG. 1 schematically illustrates an imaging device comprising a combined 2D and depth image sensor according to an example embodiment.

FIG. 1 schematically illustrates an imaging device 100 comprising a combined 2D and depth image sensor 102. The device 100 for example comprises a light signal transmission circuit 104, which drives a light-emitting diode (LED) 106. The LED for example emits light at a wavelength in the near infrared spectrum, for example in the range 700 to 1000 μm. The light signal generated by the LED 106 is for example transmitted into the image scene via one or more lenses (not illustrated in FIG. 1). Light of the light signal reflected back from the image scene is captured by the image sensor 102, for example via an imaging lens system 107 and an array of micro lenses 108, which focus light on to the individual pixels of the image sensor 102.

The sensor 102 for example comprises a plurality of pixels capable of receiving the light signal reflected by the image scene and of detecting a phase of the received signal to form a depth image. These pixels will be referred to herein as depth pixels. The image sensor 102 further comprises a plurality of pixels capable of capturing visible light from the image scene to form a 2D image, these pixels being referred to herein as 2D image pixels.

A processor 110 of the imaging device 100 is for example coupled to the image sensor 102 and to the light signal transmission circuit 104, and determines, based on signals captured by the depth pixels of the image sensor 102, the corresponding distances of objects in the image scene. The 2D image captured by the image sensor 102 and the depth image generated by the processor 110 are for example stored in a memory 112 of the imaging device 100.

Figure 2:
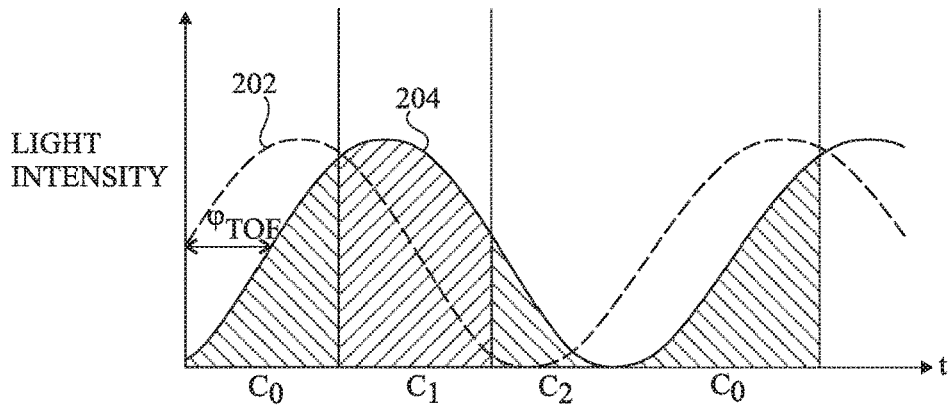
FIG. 2 is a graph illustrating examples of light intensity of a transmitted and returned light signal according to an example embodiment.

FIG. 2 is a graph representing, by a dashed curve 202, an example of the light intensity of the light signal transmitted by the photodiode 106 into the image scene, and by a solid-line curve 204, an example of the light intensity of the light signal received by one of the depth pixels of the image sensor 102. While for ease of comparison these signals are shown in FIG. 2 as having the same intensity, in practice the light signal received by each depth pixel is likely to be significantly weaker than the transmitted signal. In the example of FIG. 2, the light signal is in the form of a sine wave. However, in alternative embodiments it could have a different periodic form, for example composed of a sum of sine waves.

Rather than being based on an array of SPADs, the depth pixels of the present disclosure are based on photosensors used to detect the phase of the received light signal. There is a phase shift $\varphi_{TOF}$ between the transmitted light signal and the received light signal, which represents the time of flight (ToF) of the light signal from the photodiode 106 to the image sensor 102 via an object in the image scene that reflects the light signal. An estimation of the distance d to the object in the image scene can thus be calculated using the equation:

$$d = \frac{c_{light}}{4\pi f}\varphi_{TOF}$$

where $c_{light}$ is the speed of light, and f is the frequency of the light signal.

The phase shift $\varphi_{TOF}$ is for example estimated based on sampling the signal captured by a depth pixel during at least three distinct sampling windows during each period of the light signal. A technique based on the detection of four samples per period is described in more detail in the publication by R. Lange and P. Seitz entitled "Solid-state TOF range camera", IEE J. on Quantum Electronics, vol. 37, No. 3, March 2001, the contents of which is hereby incorporated by reference to the extent permitted by the law. The present embodiment is for example based on the detection of three samples per period.

The samples of each sampling window are for example integrated over a high number of periods, for example over around 100 k periods, or more generally between 10000 and 10 million periods. Each sampling window for example has a duration of up to one third of the period of the light signal. These sampling windows are labelled $C_0$, $C_1$ and $C_2$ in FIG. 2, and in the example of FIG. 2 each sampling window is of equal duration and the three sampling windows have a total cycle time equal to the period of the light signal. More generally, there may or may not be a time interval separating one sampling window from the next, and in some cases there could be an overlap between sampling windows. The sampling windows each for example have a duration of between 25 and 40 percent of the period of the light signal in the case of a pixel capturing three samples per period.

The timing of the sampling windows $C_0$ to $C_2$ is controlled to be synchronous with the timing of the transmitted light signal. For example the light signal transmission circuit 104 generates the light signal based on a clock signal CLK, and the image sensor 102 receives the same clock signal CLK for controlling the end time of each of the sampling windows, using for example delay elements to induce the appropriate phase shifts.

Based on the integrated samples of the light signal, and for a purely sinusoidal light wave, the phase shift $\varphi_{TOF}$ of the light signal can be determined using the following equation:

$$\varphi_{TOF} = \arctan\left(\frac{\sqrt{3}(C_2 - C_1)}{(C_0 - C_1) + (C_0 - C_2)}\right)$$

In some embodiments, the frequency f of the light signal is at 25 MHz, or more generally in the range 20 to 200 MHz.

Figure 3:
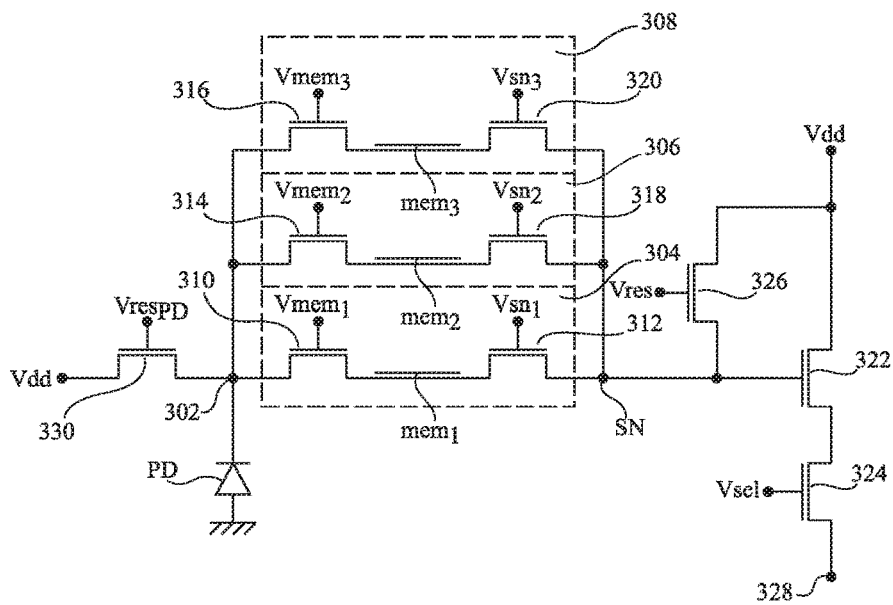
FIG. 3 schematically illustrates the circuit of a pixel capable of detecting depth information according to an example embodiment.

FIG. 3 is a circuit diagram illustrating an example of a ToF pixel circuit 300. Such a circuit is described in more detail in the French patent application assigned application number FR 15/63457 (attorney ref: B14596), the contents of which is hereby incorporated by reference to the extent permitted by the law. For example, a timing diagram illustrating an example of operation of this circuit is presented in FIG. 3 of FR 15/63457, and the same example of operation applies in the context of present disclosure.

The circuit 300 comprises a photosensitive element PD coupled between a node 302 and a reference supply rail, the photosensitive element for example being a photodiode. Node 302 is coupled to a sense node SN via the parallel connection of three sampling circuits 304, 306, 308. The sampling circuit 304 comprises a memory mem$_1$ coupled to the node 302 via a transfer gate 310, which is for example an n-channel MOS transistor. The memory mem$_1$ is also coupled to the sense node SN via a further transfer gate 312, which is for example also an n-channel MOS transistor. The transfer gate 310 is controlled by a signal Vmem$_1$ applied to its control node, and the transfer gate 312 is controlled by a signal Vsn$_1$ applied to its control node. The sampling circuits 306 and 308 comprise similar circuit elements to the sampling circuit 304, and in particular the circuits 306, 308 respectively comprise memories mem$_2$, mem$_3$, transfer gates 314, 316 respectively controlled by signals Vmem$_2$, Vmem$_3$, and further transfer gates 318, 320 respectively controlled by signals Vsn$_2$, Vsn$_3$. The memories mem$_1$, mem$_2$ and mem$_3$ provide charge storage zones in which charge transferred from the photosensitive element PD is temporarily stored.

The circuit 300 further comprises an output circuit formed of a source-follower transistor 322, a selection transistor 324 and a reset transistor 326, these transistors for example being n-channel MOS transistors. The sense node SN is coupled to the control node of transistor 322, which for example has its drain coupled to the Vdd supply voltage rail, and its source coupled to an output line 328 of the pixel circuit 300 via the transistor 324, which is controlled by a signal Vsel applied to its gate. Sense node SN is also coupled to the Vdd supply voltage rail via the transistor 326, which is controlled by a signal Vres applied to its gate. In alternative embodiments, the output circuit could be shared by several pixels, the sense node SN for example being further coupled to the sampling circuits of one or more adjacent pixels.

The circuit 300 for example further comprises a transistor 330 coupling the node 302 to the supply voltage rail Vdd and permitting the photosensitive element PD to be reset. The transistor 330 is for example controlled by a signal $V_{resPD}$.

To determine the phase shift $\varphi_{TOF}$ between the transmitted light signal and the light signal received by the pixel, the received light signal is sampled by transferring, successively and at regular intervals, charges photogenerated in the photosensitive element PD during the first sampling window $C_0$ towards the memory mem$_1$, charges photogenerated in the photosensitive element PD during the second sampling window $C_1$ towards the memory mem$_2$, and charges photogenerated in the photosensitive element PD during the third sampling window $C_2$ towards the memory mem$_3$. These three successive transfers are repeated a large number of times, for example 100,000 times, before the signals held by the memories mem$_1$, mem$_2$ and mem$_3$ are successively read out via the output circuit.

Figure 4:
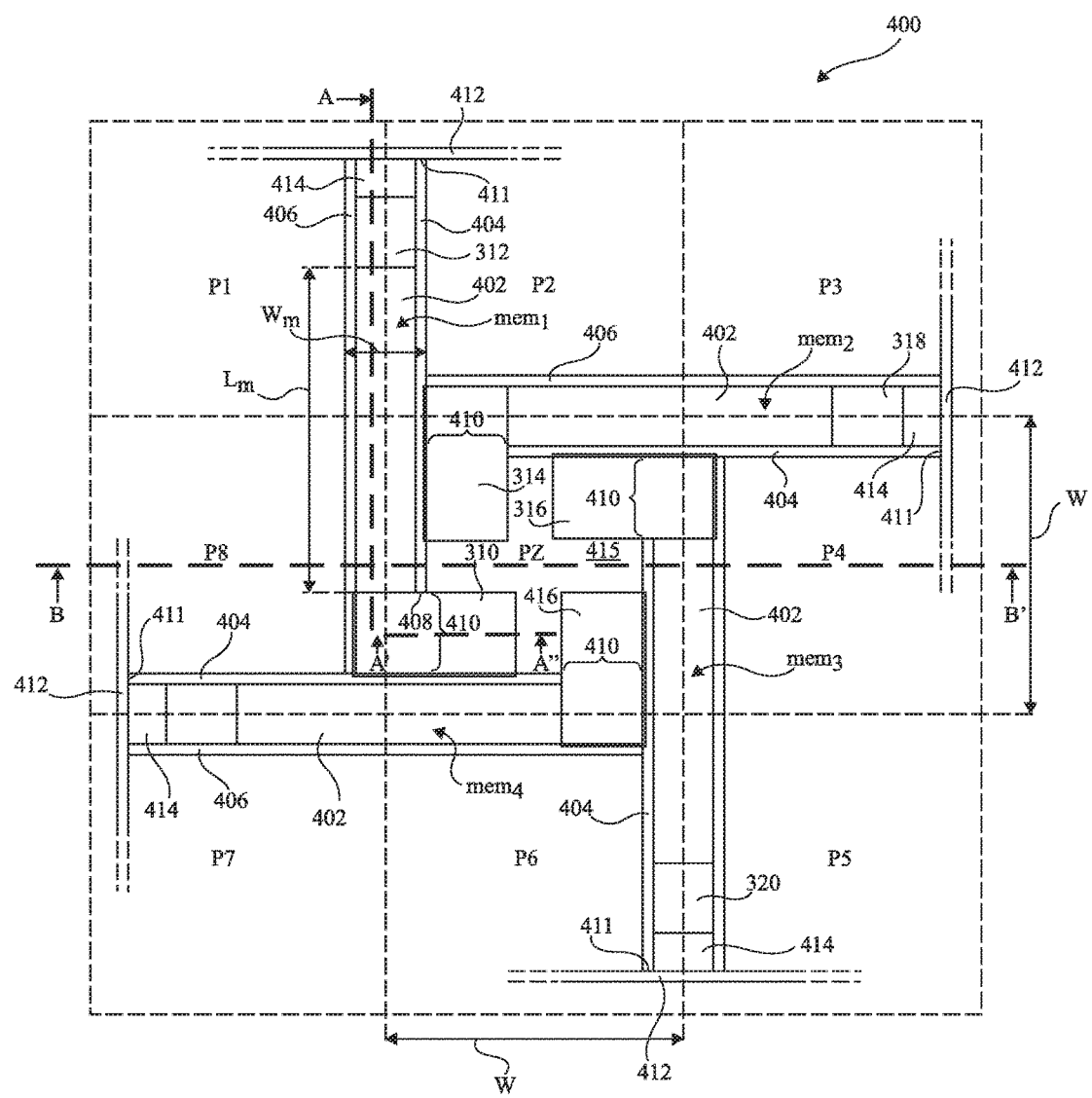
FIG. 4 is a plan view of a pixel capable of detecting depth information according to an example embodiment.

FIG. 4 is a plan view of a three-by-three block 400 of pixels forming part of the image sensor 102 of FIG. 1 according to an example embodiment. In the example of FIG. 4, a central pixel PZ is a depth pixel for detecting the return signal of the light signal transmitted into the image scene in the case of a pixel capturing four samples per period. The surrounding eight pixels P1 to P8 are for example 2D image pixels for capturing a 2D visible light image projected from the image scene.

The depth pixel has relatively large dimensions in view of the memories mem$_1$ to mem$_4$ for storing the samples. It is advantageously accommodated by positioning these memories along respective edges of the depth pixel, and by extending these memories beyond the limits of the depth pixel such that they form isolation walls that act as charge barriers between the photosensitive zones of the surrounding pixels. As will be described in more detail below, the memories mem$_1$ to mem$_4$ are for example memory zones formed by vertical charge storage regions defined by parallel walls having insulated electrodes to which a biasing voltage can be applied in order to allow the storage of electrons. The memory zones are advantageously shielded from light, as will be described in more detail below.

As represented in the example of FIG. 4, the memory zone mem$_1$ for example extends along a left-hand edge of the depth pixel and then between the pixels P1, P2 forming the top-left and top-center pixels of the three-by-three pixel block 400. The memory zone mem$_2$ for example extends along a top edge of the depth pixel and then between the pixels P3, P4 forming the top-right and right-center pixels of the three-by-three pixel block 400. The memory zone mem$_3$ for example extends along a right-hand edge of the depth pixel and then between the pixels P5, P6 forming the bottom-right and bottom-center pixels of the three-by-three pixel block 400. The memory zone mem$_4$ for example extends along the bottom edge of the depth pixel, and then extends between the pixels P7, P8 forming the bottom-left and left-center pixels of the three-by-three pixel block 400.

In some embodiments, rather than storing a fourth sample, the memory zone mem$_4$ could be used for photodiode reset and/or for anti-blooming purposes.

Each of the memory zones mem$_1$ to mem$_4$ is for example formed by a storage volume 402 sandwiched between a pair of parallel, straight walls 404, 406. The walls 404, 406 are for example active isolation trenches formed by a conductive core coated with an insulating layer. The conductive core is for example in the form of a wall extending the length and depth of the active isolation trench. A biasing voltage is for example applied to the conductive core of each wall so that charge can be stored within the storage volumes 402 of the memory zones mem$_1$ to mem$_4$. In some embodiments the biasing voltage is a negative voltage, for example of around −2 V, in order to decrease dark signal.

The walls 404 are for example inner walls that are shorter than the outer walls 406, one end 408 of the walls 404 being spaced from the side of the wall 404 of an adjacent memory zone by an opening 410, and the other end 411 for example extending to the side of further walls 412 (only partially illustrated in FIG. 4) at the far side of the surrounding pixels. The output walls 406 for example extend from the side of the wall 404 of an adjacent memory zone to the side of the corresponding wall 412. A contact zone 414 is for example formed adjacent to the end formed between the walls 404, 406 of each memory zone.

It will be noted that the walls 404, 406 of each memory zone are all straight walls. Thus the storage volumes 402 of each memory extend in a straight line, without any corner or bends. This advantageously facilitates the transfer of charge into these storage volumes 402 and the evacuation of charge from these storage volumes 402.

Furthermore, the storage volumes for example have a relatively high aspect ratio. For example, the memory zone mem$_1$ has an aspect ratio defined as $L_m/W_m$, where $L_m$ is the length of the storage volume 402 from the inner edge of the gate of transistor 312 to the level of the end 408 of the wall 404, and $W_m$ is the width of the storage volume 402 between the outer edges of the walls 404, 406. This aspect ratio is for example equal to at least 3, and in some embodiments it is equal to 5 or more. Each of the other memory zones mem$_2$, mem$_3$, mem$_4$ for example has a similar aspect ratio. Such an aspect ratio for example has the advantage of ensuring a relatively high charge storage capacity and effective charge evacuation.

The length $L_m$ of the storage volume 402 is for example greater than the width w of each side of the depth pixel. The dimensions of the depth pixel are for example the same as the dimensions of the 2D image pixels. For example, the length w of each of the depth pixels and of each of the 2D image pixels is less than 10 µm, and for example less than 5 µm.

The transfer gates 310, 314, 316 and 416 are for example formed adjacent to the corresponding openings 410 in the inner walls 404 of the memory zones $mem_1$ to $mem_4$. The photo-generation zone of the depth pixel PZ for example includes a central charge collection region 415 and regions under the transfer gates 310, 314, 316 and 416 of the memory zones $mem_1$ to $mem_4$. Thus, when a voltage is applied to one of the transfer gates 310, 314, 316 or 416, the charge present in the photo-generation zone will be transferred to the corresponding memory zone via the corresponding opening 410 in the wall 404.

It will be noted that the photo-generation zone of the photodiode PD is relatively small, being smaller than the pixel dimensions. The present inventors have found that this is not detrimental to the correct capture of photons as in any case the sampling rates of the transfer gates are such that the photo-generated charges have only a short time to be evacuated, and therefore large pixel dimensions will not necessarily lead to an increased signal. Furthermore, the use of microlenses, such as those labelled 108 in FIG. 1, can compensate for the relatively small photosensitive area by increasing the sensitivity.

Figure 5A:
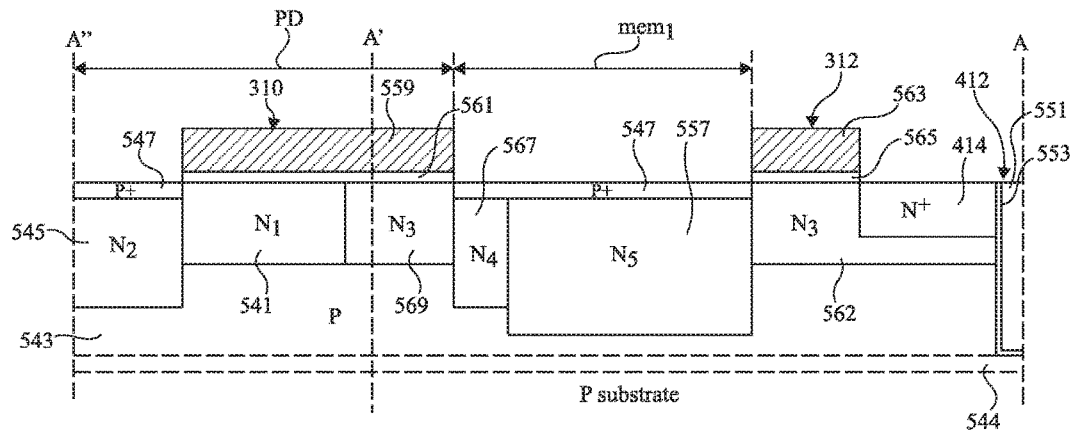
FIG. 5A is a cross-section view along a line A-A'-A" of FIG. 4 according to an example embodiment.

FIG. 5A is a cross-section taken along a line A-A'-A" running through the structure of FIG. 4, and in particular running along the length of the memory $mem_1$, and then making a right-angled turn to run through the opening 410 and across the transfer gate 310. The other memory zones $mem_2$ to $mem_4$ for example have a similar structure.

The photo-generation zone for example comprises an n-type region 541, having a doping level $N_1$, formed over a p-type semiconductor substrate 543. In some embodiments, rather than being the substrate, the p-type layer 543 could be a SOI (silicon on insulator) layer formed by epitaxy and position on a buried oxide (BOX) layer 544 (represented with dashed lines in FIG. 5A). The charge collection zone is for example formed by an n-type region 545 having a doping level $N_2$ that is higher than $N_1$. The region 545 is for example covered by a strongly doped p-type (P+) layer 547, which for example forms a passivation layer.

One of the isolation walls 412 is illustrated in FIG. 5A comprising a conducting core 551, formed for example of polysilicon, surrounded by an insulating layer 553, formed for example of silicon oxide.

The memory zone $mem_1$ for example comprises an n-type well 557 having a doping level $N_5$ greater than $N_1$, covered by a P+ layer 547. The memory zone $mem_1$ is for example separated from the charge collection zone 545 by the region 541 covered by a gate 559 of the transfer transistor 310, this gate being separated from the region 541 by a gate isolation layer 561. Furthermore, the memory zone $mem_1$ is for example separated from the contact region 414 by an n-type region 562, covered by a gate 563 of the transistor 312, the gate 563 being separated from the region 561 by a gate insulator 565.

The memory zone $mem_1$ also for example comprises an n-type region 567 positioned between the n-type well 557 and the transfer gate 310. This region 567 for example has a doping level $N_4$ greater than $N_1$ and lower than $N_5$, and is covered by the P+ layer 547. In some embodiments, the region 541 extends to the region 567 of the memory zone $mem_1$. However, in the example of FIG. 5A, a further n-type region 569 is formed under the gate 310 and separates the regions 541 and 567. The region 569 for example has a doping level $N_3$ greater than $N_1$ and lower than $N_4$ and $N_5$. In some embodiments, the doping level $N_3$ is also lower than $N_2$.

While not shown in FIG. 5A, the memory formed by the n-type regions 567 and 557 is for example masked by covering it with a light shield. Furthermore, in some embodiments, the light shield extends to at least partially cover the gate 559, and for examples covers at least some or all of the n-type region 569.

FIGS. 5B to 5E represent electrostatic voltages along the same cross-section A-A'-A" through the structure of FIG. 4 as that represented in FIG. 5A. In these figures, low voltages are represented by high levels of the curves, and vice versa.

Figure 5B:
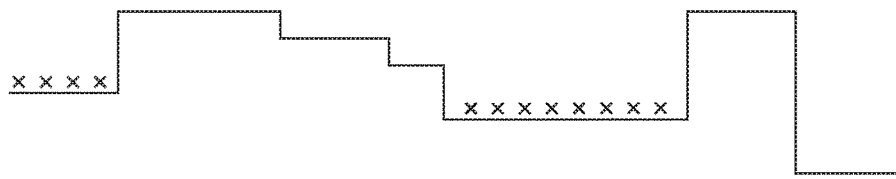
FIGS. 5B to 5E illustrate electrostatic voltages in the structure of FIG. 5A during different operating phases according to an example embodiment.
Figure 5C:
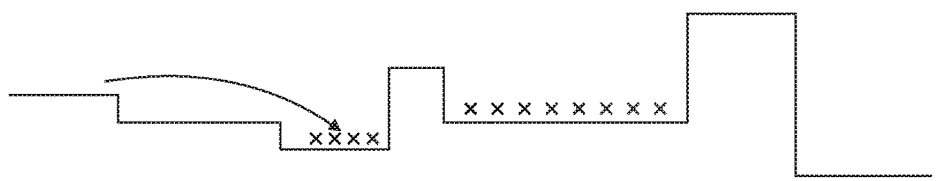
Figure 5D:
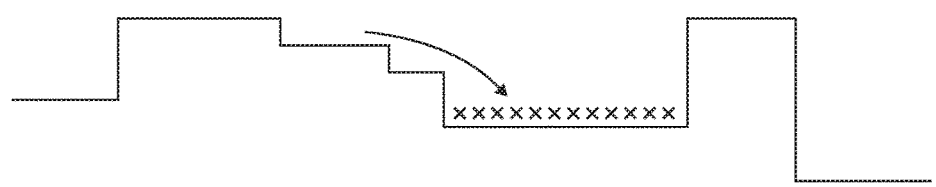

FIGS. 5B to 5D illustrate a transfer phase of charge from the charge collection area 545 to memory zone $mem_1$. FIG. 5B illustrates a step in which the transistors 310 and 312 are maintained in a non-conducting state by a negative or ground voltage applied to their gates. FIG. 5C illustrates a step in which the transfer gate 310 is rendered conductive, for example by application of a supply voltage VDD to its gate, bringing the electrostatic voltage under the gate 310 to above that of the charge collection area 545, and thereby causing the charges to be transferred to the region 569 under the gate. FIG. 5D illustrates a subsequent step in which the voltage applied to the gate of the transistor 310 is returned to a low level, such that the electrostatic voltage of the region holding the transferred charge falls lower than that of the regions 567 and 557 of the memory zone $mem_1$, and thus the charge is transferred to the charge storage region of the memory zone.

Figure 5E:
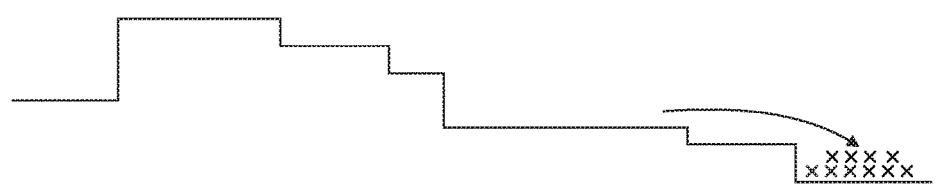

FIG. 5E illustrates a subsequent phase during which charge is transferred out of the memory via the contact region 414. As illustrated, for this, the transistor 312 is controlled by a high voltage, for example at the supply voltage Vdd, and thus the electrostatic voltage under the gate 563 becomes higher than that of the charge storage region 557 of the memory zone, and charge is transferred to the contact region 414, which for example has a higher electrostatic voltage than the region 557.

Figure 6:
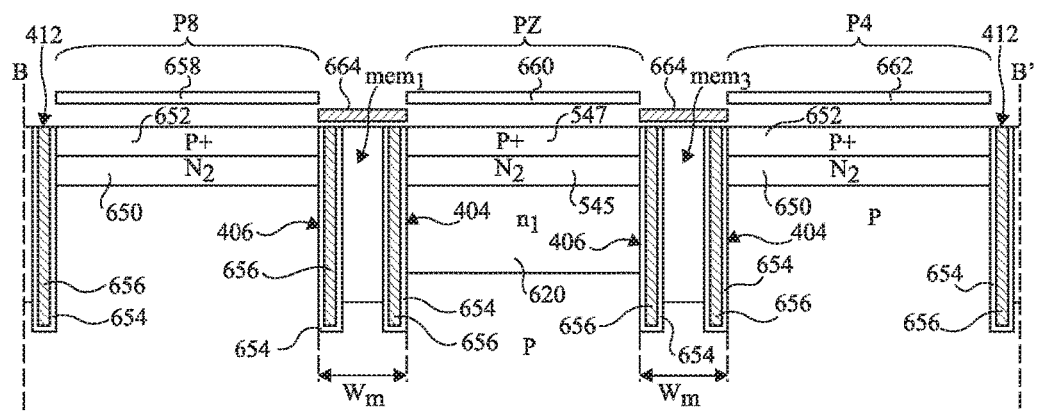
FIG. 6 is a cross-section view along a line B-B' of the pixel of FIG. 4 according to an example embodiment.

FIG. 6 is a cross-section view taken along a line B-B' running through the structure of FIG. 4, and in particular crossing the pixels P8, PZ and P4, and the memory zones $mem_1$ and $mem_3$ on either side of the pixel PZ. The memory zones $mem_2$ and $mem_4$ are not illustrated but for example have a similar structure to the memory zones $mem_1$ and $mem_3$.

As illustrated, each of the pixels P8 and P4 for example comprises a pinned photodiode formed of an n-type layer 650 positioned beneath a heavily doped p-type layer (P+) 652. Each of the walls 404, 406 of the memories $mem_1$, $mem_3$ is formed by a trench lined with a layer 654 of an insulator such as oxide and filled with a conductive core 656, formed for example of a silicide. The width $w_m$ of the memories $mem_1$, $mem_2$, from the outside surfaces of the walls 404, 406 is for example around 1 µm, or more generally between 0.8 and 2 µm.

In some embodiments, light filters 658, 660, 662 are positioned over the pixels P8, PZ and P4 respectively. The filters 658 and 662 are for example colour filters, such as red, green or blue filters, for permitting only light having a limited wavelength range to enter the 2D image pixels. The filter 660 is for example a NIR filter permitting only light in the near infrared wavelength range to enter the pixel PZ.

Light shields 664 opaque to light are for example positioned over each of the memory zones $mem_1$, $mem_3$, such that light from the image scene does not directly enter these memories and generate parasitic charges. The light shields 664 are for example formed of a suitable metal such as tungsten, aluminium or copper.

Figure 7A:
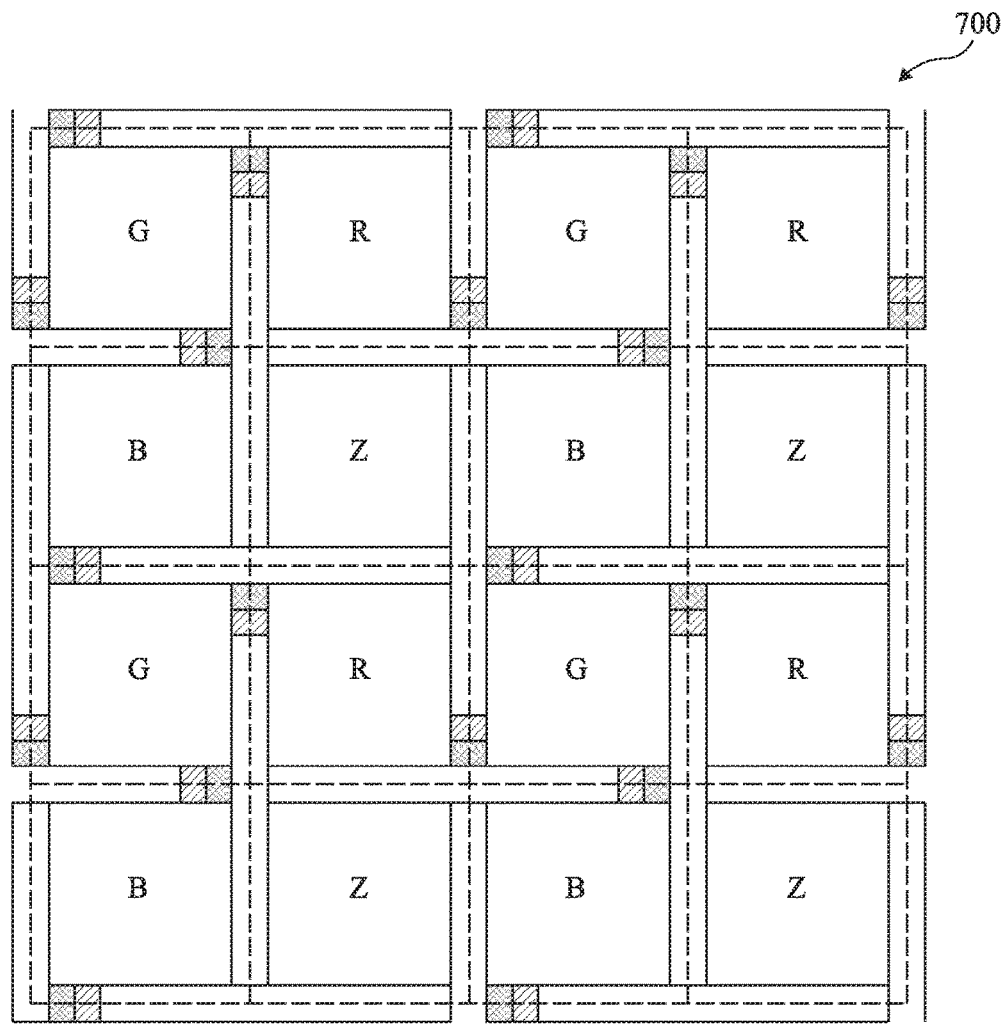
FIGS. 7A to 7C are plan views of the layout of part of a combined 2D and depth image sensor according to example embodiments.

FIG. 7A is a plan view of a four-by-four block 700 of pixels of the image sensor 102 according to an example embodiment. In the example of FIG. 7A, each two-by-two pixel block is composed of pixels covered by a green filter (G), a red filter (R), a blue filter (B) and an NIR filter (Z). The memories associated with the depth pixels Z form isolation walls between neighbouring colour pixels in a similar manner to the example of FIG. 4. For ease of illustration, the memories are each represented by rectangles having at one end shaded regions representing the transfer gate and contact region for transferring charge out of the memory.

In the example of FIG. 7A, the density of depth pixels is such that the corresponding memories provide barriers between all of the pixels of the array. Indeed, FIG. 7A illustrates some memories associated with neighbouring depth pixels of the four-by-four block. It is only at the edge of the pixel array that some barriers may be missing, but such barriers could be implemented by isolation trenches, such as by shallow isolation trenches (STI), deep isolation trenches (DTI) or by the same type of isolation wall as the one used to delimit the memories.

Figure 7B:
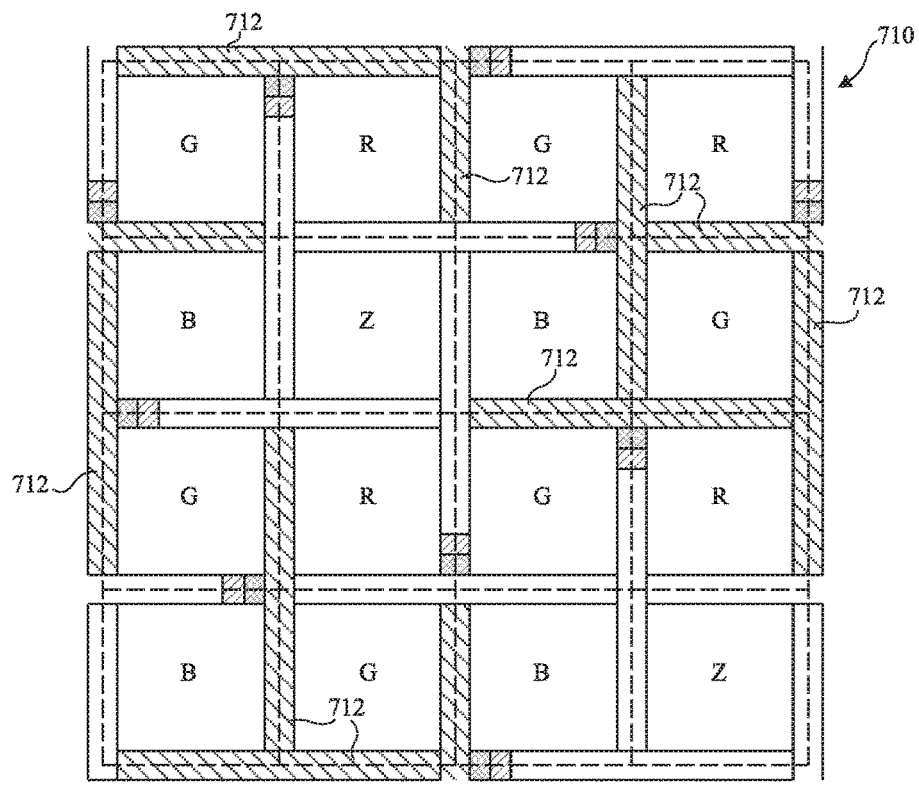

FIG. 7B is a plan view of a four-by-four block 710 of pixels of the image sensor 102 according to an alternative example embodiment to that of FIG. 7A.

In the example of FIG. 7B, a lower density of depth pixels is provided than in the embodiment of FIG. 7A. For example, the pixel array is formed by two-by-two blocks of pixels, some of which comprise, going clockwise, green, red, green and blue pixels, and some of which comprise, going clockwise, green, red, depth and blue pixels. The relatively high spacing between the depth pixels means that the corresponding memories provide barriers between only some of the 2D image pixels of the array. Where no memory is present, the pixels are for example separated by isolation trenches 712 provided as barriers between adjacent pixels. These isolation trenches 712 are for example formed as dummy memories have the same structure as the memories of the depth pixels, except that the opening 410 of FIG. 4 could be omitted. The conductive cores formed in the walls of the dummy memories are for example coupled to the same continuous biasing voltage as those of the depth pixels.

Figure 7C:
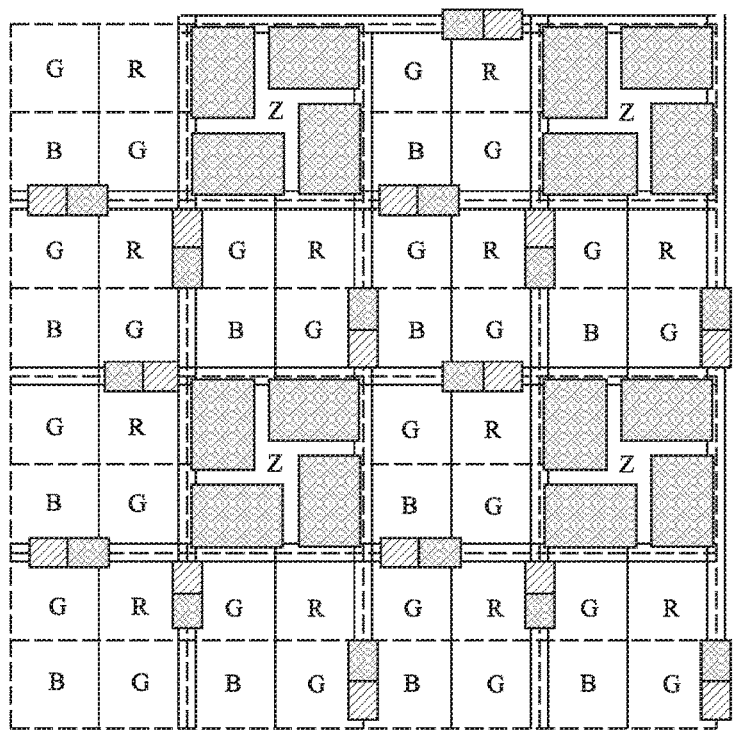

FIG. 7C is a plan view of a block 720 of pixels of the image sensor 102 according to an alternative example embodiment to those of FIGS. 7A and 7B.

In the example of FIG. 7C, each depth pixel Z has a surface area corresponding to a two-by-two block of 2D image pixels. For example, the 2D image pixels are arranged in two-by-two blocks having, going clockwise, green, red, green and blue pixels. One block of two-by-two image pixels at regular intervals is replaced by a single depth pixel. More generally, the 2D image pixels could be arranged in n-by-n blocks of pixels, and each depth pixel could occupy the space of an n-by-n block of pixels, where n is an integer equal to or greater than 2.

In the example of FIG. 7C, the memories extending from the depth pixels each form at least partial barriers between more than one pair of adjacent 2D image pixels. Of course, while FIG. 7C illustrates an example in which each depth pixel is surrounded by eight two-by-two blocks of 2D image pixels, in alternative embodiments a different density of depth pixels would be possible.

Of course, while in the embodiments of FIGS. 7A, 7B and 7C the 2D pixels are green, red and blue colour pixels, in alternative embodiments these pixels could be unfiltered pixels without any colour filter, or having a filter that filters out the NIR wavelengths. For example, a filter transmitting a wavelength range from around 400 nm to around 700 nm could be used for these pixels.

Figure 8:
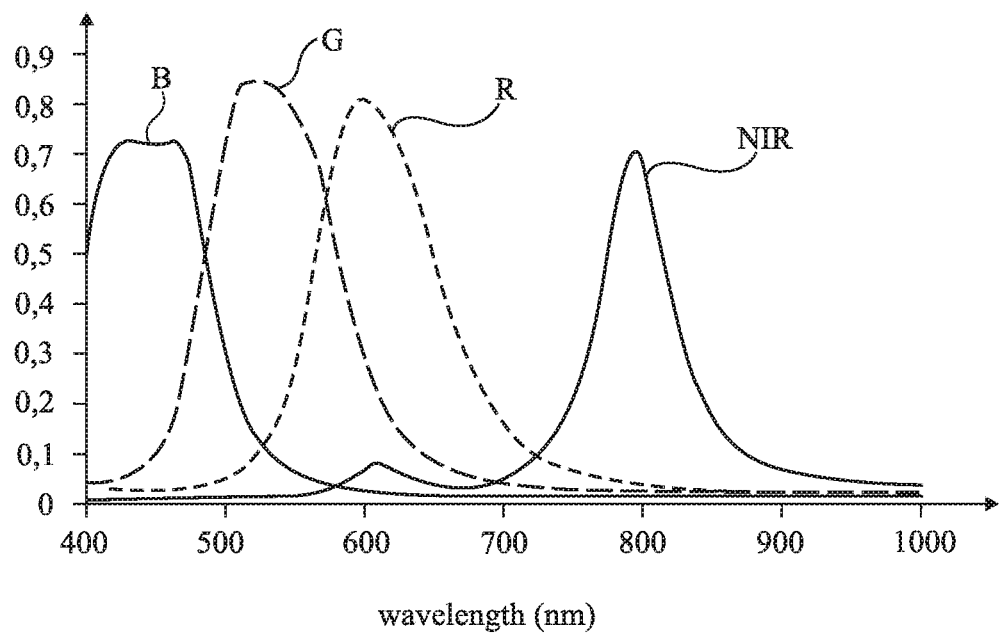
FIG. 8 is a graph representing the transmission of RGB (red, green, blue) and NIR (near-infrared) filters according to an example embodiment.

FIG. 8 is a graph illustrating examples of the wavelength ranges transmitted by blue, green and red colour filters (BGR) and by an NIR filter according to an example embodiment. For example, these filters are characterised by the following transmission ranges for which the transmission is equal to or greater than 0.5:

Blue: wavelength range from around 400 nm to around 490 nm;
Green: wavelength range from around 490 nm to around 590 nm;
Red: wavelength range from around 560 nm to around 660 nm;
NIR: wavelength range from around 780 nm to around 820 nm.

Figure 9:
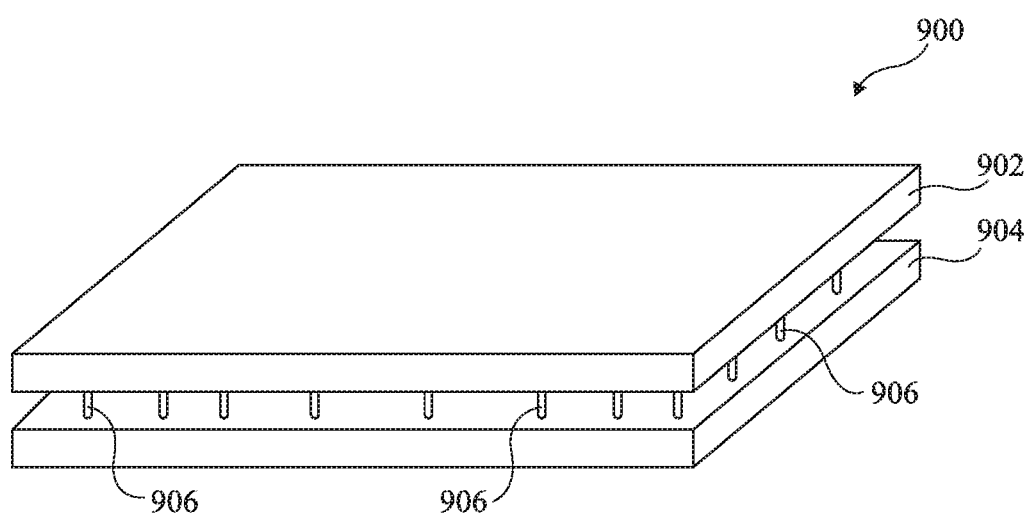
FIG. 9 is a perspective view of an imaging device implemented in a 3D circuit according to an example embodiment.

FIG. 9 is a perspective view of a 3D circuit 900 comprising stacked devices 902, 904, which are for example interconnected by vertical 3D vias 906. The device 902 for example comprises the image sensor 102, which is for example backside illuminated. The circuit 904 for example comprises some or all of the transistors associated with each pixel, such as the transistor 326 of FIG. 3. The circuit 904 may additionally or alternatively comprise some or all of the transistors forming the output circuit associated with each pixel, such as the transistor 322 and/or 324 of FIG. 3.

In some embodiments, the relatively high frequency signals $Vmem_1$, $Vmem_2$, $Vmem_3$ used to drive the transfer gates 310, 314, 316 are provided on wires in a different device from the device used to provide the signals form driving the transfer gates of the 2D image pixels. For example, the signals $Vmem_1$, $Vmem_2$, $Vmem_3$ are supplied to the pixels of the device 902 from wires on the device 904 and through the vertical 3D vias 906 between the devices 902, 904. Other transistor arrangements and wire partitioning could be used by those skilled in the art to optimize layout and pixel array density.

An advantage of the embodiments described herein is that the arrangement of the depth pixel in the 2D and depth image sensor enables three or more memories to be coupled to the photo-generation zone of the pixel without significantly increasing the pixel size with respect to the other pixels in the array. Furthermore, the memories advantageously provide effective barriers between surrounding image pixels.

Having thus described at least one illustrative embodiment, various alterations, modifications and improvements will readily occur to those skilled in the art. For example, while a particular example of the layout of a depth pixels has been described in relation with FIG. 4, it will be apparent to those skilled in the art that modifications could be made. For example, the fourth memory $mem_4$ could be omitted in some embodiments.

Furthermore, the memories could extend in the opposite direction to what is shown in the example of FIG. 4, the memory $mem_1$ extending between pixels P6 and P7, the memory $mem_2$ extending between the pixels P8 and P1, the memory $mem_3$ extending between the pixels P2 and P3, and the memory $mem_4$ extending between the pixels P4 and P5.

Furthermore, it will be apparent to those skilled in the art that while regions having n-type and p-type doping have been described, in alternative embodiments some or all of these regions could have the opposite doping type. For example, the n-type region 557 of FIG. 5A forming the memory could be replaced by a p-type region, and the other regions of the structure of FIG. 5A could also have the opposite doping type.

What is claimed is:

1. An image sensor comprising:
   a depth pixel having:
   a detection zone;
   a first memory electrically coupled to the detection zone by a first gate;
   a second memory electrically coupled to the detection zone by a second gate; and
   a third memory electrically coupled to the detection zone by a third gate wherein the first, second and third memories are each formed by a doped region sandwiched between first and second parallel straight walls, the first and second walls of each memory having a conductive core adapted to receive a biasing voltage; and
   a plurality of 2D image pixels positioned adjacent to the depth pixel, wherein the first, second and third memories extend to form at least partial isolation walls between corresponding adjacent pairs of the 2D image pixels.

2. The image sensor of claim 1, wherein:
   the walls of the first memory extend between detection zones of the first and second pixels of the plurality of 2D image pixels;
   the walls of the second memory extend between detection zones of the third and fourth pixels of the plurality of 2D image pixels; and
   the walls of the third memory extend between detection zones of the fifth and sixth pixels of the plurality of 2D image pixels.

3. The image sensor of claim 2, wherein the depth pixel further comprises a further structure electrically coupled to the detection zone of the depth pixel by a fourth gate, the further structure comprising an n-type region sandwiched between parallel straight walls, and wherein the walls of the further structure extend between detection zones of the seventh and eighth pixels of the plurality of 2D image pixels.

4. The image sensor of claim 1, wherein the image sensor comprises a plurality of two-by-two blocks of pixels, at least some of said two-by-two blocks of pixels comprising the depth pixel according to claim 1 and three 2D image pixels.

5. The image sensor of claim 1, wherein the image sensor consists of a plurality of two-by-two blocks of pixels, each two-by-two block of pixels comprising the depth pixel according to claim 1 and three 2D image pixels.

6. The image sensor of claim 1, wherein the image sensor comprises an array consisting of a plurality of n-by-n blocks of 2D image pixels and a plurality of the depth pixels according to claim 1, each depth pixel occupying a space in the array corresponding to the space occupied by an n-by-n block of 2D image pixels, where n is an integer equal to 2 or more.

7. The image sensor of claim 1, wherein each 2D image pixel is isolated from adjacent 2D image pixels by corresponding isolation walls, at least some of said isolation walls being formed by said first, second and third memories, and one or more of said isolation walls being formed by an isolation trench.

8. The image sensor of claim 1, wherein the first, second and third memories each has as aspect ratio of at least 4.

9. The image sensor of claim 1, wherein the length of a charge storage region of each of said first, second and third memories is greater than the width of the depth pixel.

10. The image sensor of claim 1, wherein the depth pixel and 2D image pixels are formed in a layer of semiconductor positioned over a buried insulating layer.

11. An imaging device comprising:
    the image sensor of claim 1; and
    a light signal transmission circuit configured to transmit light in the near infrared range.

12. The imaging device of claim 11, wherein the depth pixel is covered by a filter having a pass band limited to the near infrared range.

* * * * *